(12) United States Patent
Kim et al.

(10) Patent No.: US 11,848,068 B2
(45) Date of Patent: Dec. 19, 2023

(54) MEMORY CHIP HAVING ON-DIE MIRRORING FUNCTION AND METHOD FOR TESTING THE SAME

(71) Applicant: SAMSUNG ELECTRONICS CO., LTD., Suwon-si (KR)

(72) Inventors: Byoungsul Kim, Suwon-si (KR); Hokyong Lee, Yongin-si (KR); Hwajin Jung, Hwaseong-si (KR); Yongjoo Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/851,255

(22) Filed: Jun. 28, 2022

(65) Prior Publication Data

US 2022/0328122 A1 Oct. 13, 2022

Related U.S. Application Data

(62) Division of application No. 16/867,631, filed on May 6, 2020, now Pat. No. 11,398,292.

(30) Foreign Application Priority Data

Oct. 7, 2019 (KR) .......................... 10-2019-0123682

(51) Int. Cl.
| | |
|---|---|
| *G11C 29/44* | (2006.01) |
| *G11C 29/34* | (2006.01) |
| *G11C 29/14* | (2006.01) |
| *G11C 7/10* | (2006.01) |
| *G11C 29/12* | (2006.01) |
| *G11C 29/18* | (2006.01) |

(52) U.S. Cl.
CPC ............ *G11C 29/44* (2013.01); *G11C 7/1045* (2013.01); *G11C 29/14* (2013.01); *G11C 29/34* (2013.01); *G11C 2029/1202* (2013.01); *G11C 2029/1204* (2013.01); *G11C 2029/1802* (2013.01)

(58) Field of Classification Search
CPC ....... G11C 29/44; G11C 7/1045; G11C 29/14; G11C 29/34; G11C 2029/1202; G11C 2029/1204; G11C 2029/1802
See application file for complete search history.

(56) References Cited

U.S. PATENT DOCUMENTS

| | | | | |
|---|---|---|---|---|
| 6,212,089 B1 * | 4/2001 | Kajigaya | .......... | G11C 29/50012 |
| | | | | 365/205 |
| 6,560,148 B2 * | 5/2003 | Takami | ................ | G11C 7/1006 |
| | | | | 365/220 |

(Continued)

FOREIGN PATENT DOCUMENTS

| KR | 10-1997-0024536 | 5/1997 |
|---|---|---|
| KR | 10-0609540 | 7/2006 |
| KR | 10-2015-0016605 | 2/2015 |

*Primary Examiner* — Tuan T Nguyen
(74) *Attorney, Agent, or Firm* — F. Chau & Associates, LLC

(57) ABSTRACT

A method for testing a memory chip including: performing an electrical die sorting (EDS) test on the memory chip; performing a package test when the EDS test is passed; performing a module test when the package test is passed; performing a mounting test when the module test is passed; and setting the memory chip to a mirroring mode through a fusing operation when the EDS test, the package test, the module test or the mounting test is failed.

6 Claims, 12 Drawing Sheets

(56) References Cited

U.S. PATENT DOCUMENTS

| | | | |
|---|---|---|---|
| 6,781,895 B1 * | 8/2004 | Tanaka | G11C 29/785 |
| | | | 365/201 |
| 7,895,482 B2 | 2/2011 | Fischer et al. | |
| 8,689,041 B2 | 4/2014 | Lu | |
| 9,778,984 B1 | 10/2017 | Plants | |
| 9,996,411 B1 * | 6/2018 | Chinnakkonda Vidyapoornachary | G06F 11/1423 |
| 10,157,685 B2 | 12/2018 | Kim et al. | |
| 2018/0091170 A1 * | 3/2018 | Asami | G11C 11/5642 |
| 2019/0115235 A1 | 4/2019 | Ahn et al. | |
| 2021/0104291 A1 * | 4/2021 | Kim | G11C 29/783 |
| 2021/0104292 A1 | 4/2021 | Kim et al. | |
| 2021/0124659 A1 | 4/2021 | Ryu et al. | |
| 2023/0009061 A1 * | 1/2023 | Shim | G11C 11/005 |
| 2023/0197159 A1 * | 6/2023 | Hara | G11C 16/10 |
| | | | 365/164 |

* cited by examiner

Don't Care

MSB

MEMORY CHIP HAVING ON-DIE MIRRORING FUNCTION AND METHOD FOR TESTING THE SAME

CROSS-REFERENCE TO RELATED APPLICATION(S)

This application is a divisional application of U.S. patent application Ser. No. 16/867,631 filed on May 6, 2020, which claims priority under 35 U.S.C. 119(a) to Korean Patent Application No. 10-2019-0123682 filed on Oct. 7, 2019 in the Korean Intellectual Property Office, the disclosures of which are incorporated by reference herein in their entireties.

TECHNICAL FIELD

The present inventive concept relates to a memory chip, and more particularly, to a memory chip having an on-die mirroring function and a method for testing the same.

DISCUSSION OF THE RELATED ART

In general, as a Dynamic Random Access Memory (DRAM) process is miniaturized, cell characteristics of the memory become weak. For example, the likelihood of cell defects is increased. For example, cell defects may result in a memory failure which may impact data centers, autonomous vehicles, and the like. Therefore, in a case in which a single bit error or a multi-bit error occurs in a memory, an apparatus for repairing such defects may be desirable.

SUMMARY

According to an exemplary embodiment of the present inventive concept, a method for testing a memory chip including: performing an electrical die sorting (EDS) test on the memory chip; performing a package test when the EDS test is passed; performing a module test when the package test is passed; performing a mounting test when the module test is passed; and setting the memory chip to a mirroring mode through a fusing operation when the EDS test, the package test, the module test or the mounting test is failed.

According to an exemplary embodiment of the present inventive concept, a method for testing a memory chip includes: performing a test on the memory chip; and setting the memory chip to a mirroring mode through a fusing operation when a random single bit failure or a multi-bit failure is detected in the memory chip by the test.

According to an exemplary embodiment of the present inventive concept, a memory chip including: a memory cell array having a first area and a second area, wherein each of the first area and the second area has a plurality of memory cells connected to word lines and bit lines; a row decoder configured to select one of the word lines in response to a row address; a sense amplifier circuit configured to sense data from memory cells connected to selected bit lines during a read operation; a column decoder configured to select the selected bit lines from among the bit lines in response to a column address; an address buffer configured to store an address having the row address and the column address; a read failure indicator configured to detect an error in the sensed data and generate a read failure signal corresponding to the error; a mirroring mode activation signal generator configured to generate a mirroring mode activation signal corresponding to a mirroring mode by a fusing operation; and a control logic configured to write a same writing data to the first area and the second area during a write operation in the mirroring mode, and change a data output path of a read operation from a data output path of the first area to a data output path of the second area in response to a read retry command in the mirroring mode.

BRIEF DESCRIPTION OF DRAWINGS

The above and other features of the present inventive concept will be more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described with reference to the accompanying drawings.

Figure 1:
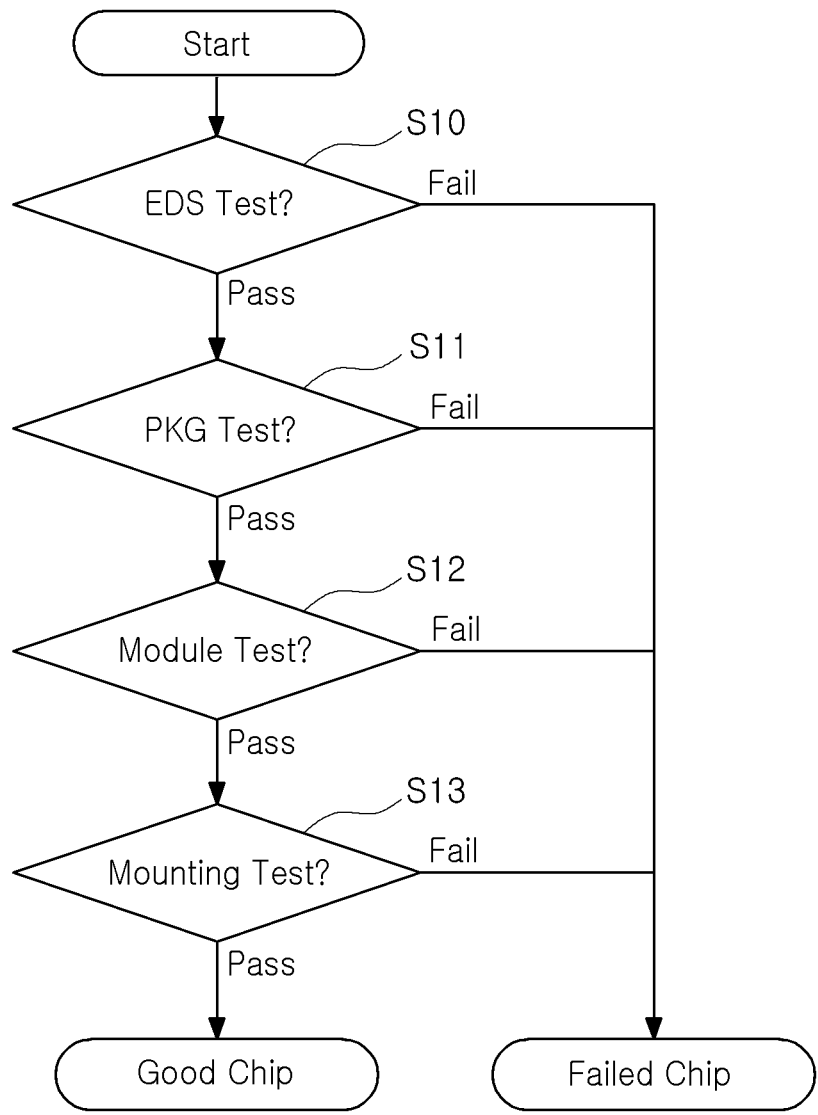
FIG. 1 is a diagram illustrating an evaluation process of a general memory chip as an example.

FIG. 1 is a diagram illustrating an evaluation process of a general memory chip as an example. Referring to FIG. 1, an evaluation process of a memory chip proceeds as follows.

An electrical die sorting (EDS) test that performs wafer evaluation is performed (S10). Semiconductor chips on a wafer are determined as good (e.g., functional and/or not defective) and failed (e.g., non-functional and/or defective) chips as a result of the EDS test. In a case in which the semiconductor chips are defective products, the semiconductor chips may be reclassified as a defect-repairable chip or a non-repairable chip by performing a redundancy process.

A package (PKG) test is performed (S11). Chips that are determined to be good in the EDS test (e.g., passing the EDS test (S10)) are assembled and packaged. The package test may be performed to distinguish good or failed chips by applying stress such as voltage/electrical signals, temperature or the like to a packaged memory chip. For example, the package test may include a DC parameter test, a dynamic function test, a device sort verification test, a low power test, and the like.

A module test is performed (S12). A good packaged memory chip (e.g., passing the PKG test (S11)) may be configured as a module. The module test determines whether the memory chip of the module is good or bad. For example, the module test (S12) may be performed to distinguish good or failed chips by applying stress such as voltage/electrical signals, temperature, external force or the like to the module.

A mounting test is performed (S13). When the memory chip of the module passes the module test, the good module is mounted on a board. The mounting test determines whether the memory chip mounted on the board is good or bad. For example, the mounting test (S13) may be performed to distinguish good or failed chips by applying stress such as voltage/electrical signals, temperature, external force or the like to the memory chip and board.

For example, when a memory chip fails any of the EDS test (S10), PKG test (S11), module test (S12), or the mounting test (S13), the memory chip may be classified as a failed chip.

Pass and fail of the memory chip are determined depending on existence or absence of a defect regarding the memory chip in respective operations. In a general test method, to secure a good product, a pass sample per operation is evaluated to final module/mounting evaluation, and a final pass sample processed as a pass is a good product. In addition, a failed sample is processed as a fail.

In addition, as the memory density increases, in the case of a single bit failure, a repair for a half chip is performed. For example, a sample in which a single bit failure occurs at a specific position is produced/shipped as a half chip.

Figure 2:
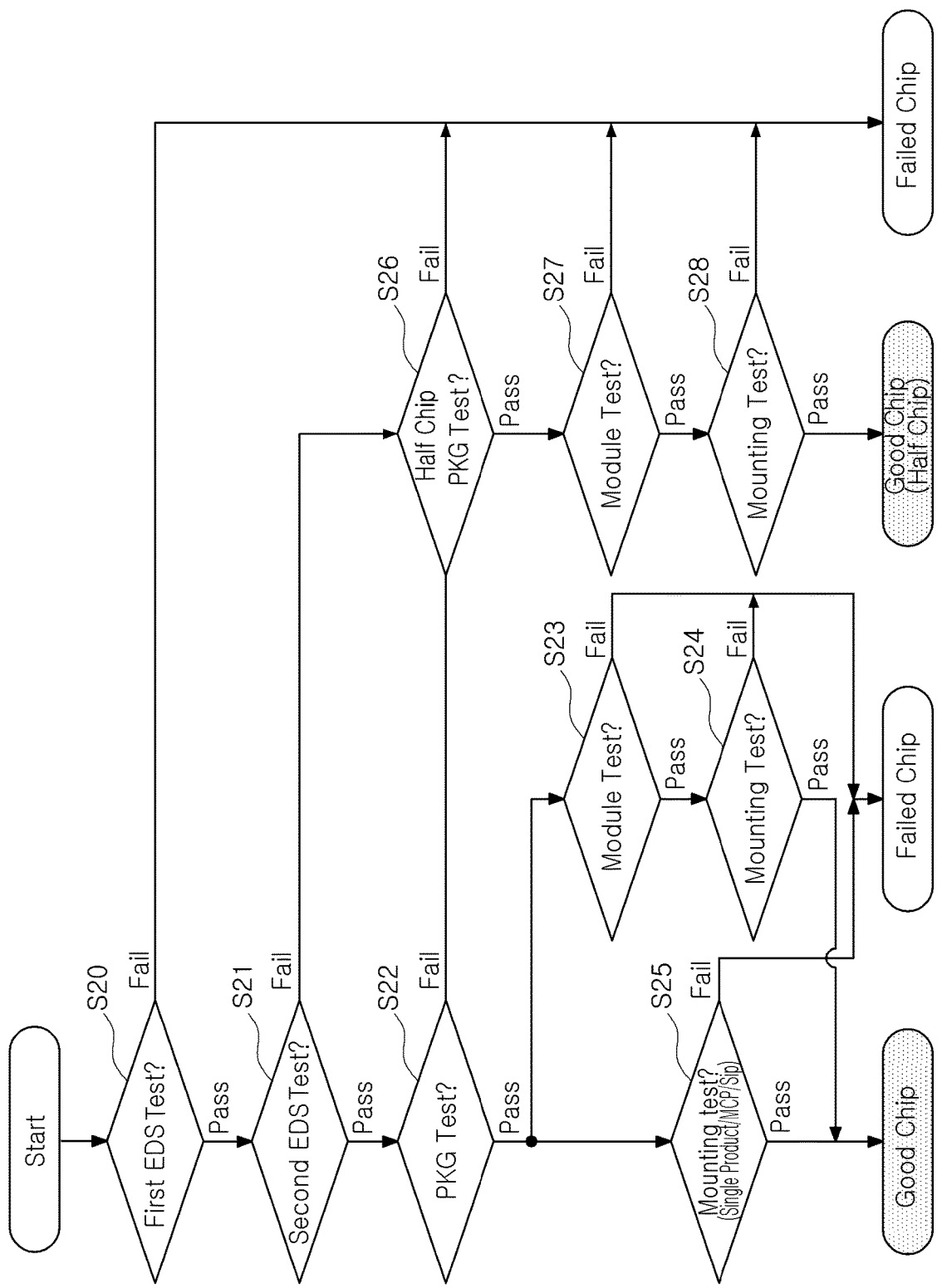
FIG. 2 is a flowchart illustrating a general memory chip repairing operation by way of example.

FIG. 2 is a flowchart illustrating a general memory chip repairing operation by way of example. Referring to FIG. 2, a memory chip repairing operation may proceed as follows for a memory chip that may have, for example, a defect.

A first EDS test may be performed (S20). The first EDS test includes a wafer level test. When the first EDS test is passed, a second EDS test may be performed (S21). The second EDS test may determine whether the memory chip is defective and whether a defective chip may be repaired. For example, when the memory chip is not defective or may be repaired even in a case in which the memory chip is defective, the second EDS test is passed. In addition, when the defect of the memory chip is not repairable, the memory chip is treated as defective and may be considered a failed chip.

The memory chip that passes the second EDS test is packaged, and then a package test is performed (S22). For example, when the package test is passed, the memory chip is configured as a module or mounted on a main board.

When the memory chip is configured as a module, a module test for the memory chip is performed (S23). When the module test is passed, the module is mounted on the board. In addition, a mounting test is performed on the mounted memory (S24). When the mounting test (S24) is passed, the memory chip is processed as a good chip.

In addition, when the memory chip that passes the package test (S22) is mounted on the main board, the mounting test is performed on the mounted memory chip (S25). The memory chip mounted on the main board may be included in a single product, a multi-chip package (MCP), or a system-in-package (SiP). When the module test of operation (S23) is failed or the mounting test of S24/S25 is failed, the memory chip is treated as defective and may be classified as a failed chip.

In addition, when the package test of operation S22 is failed, it is determined whether the memory chip is usable as a half chip. For example, when a failure of the same bank or a failure of a specific cell is determined, a half chip package test on a packaged memory chip may be performed (S26). For example, when the half chip package test is passed, the module test is performed (S27). When the module test is passed, the mounting test is performed (S28). When the mounting test is passed, the memory chip may be processed as a good chip and as a half chip. In addition, when the half chip package test of operation (S26) is failed, the module test of operation (S27) is failed, or the mounting test of operation (S28) is failed, the memory chip is treated as defective and may be classified as a failed chip.

In addition, the half chips are assembled in the module by collecting all the defective chips of the same position, such that the shipping may be determined, when being passed. However, such a half chip repairing method provides a relatively low productivity since the samples in which the locations of the single bit failures coincide are collected and finally shipped. In addition, in the case of the half chip repair method, a repair for random failure or multi-bit failure may be applied. For example, a product shipped, after a single bit failure repair was performed, has the possibility of potential failure, compared to a good sample.

In the case of a memory chip according to an exemplary embodiment of the present inventive concept, on-die mirroring for repairing random/multi-bit failures may be performed. Hereinafter, a memory chip that performs on-die mirroring will be referred to as an on-die mirroring chip.

Figure 3:
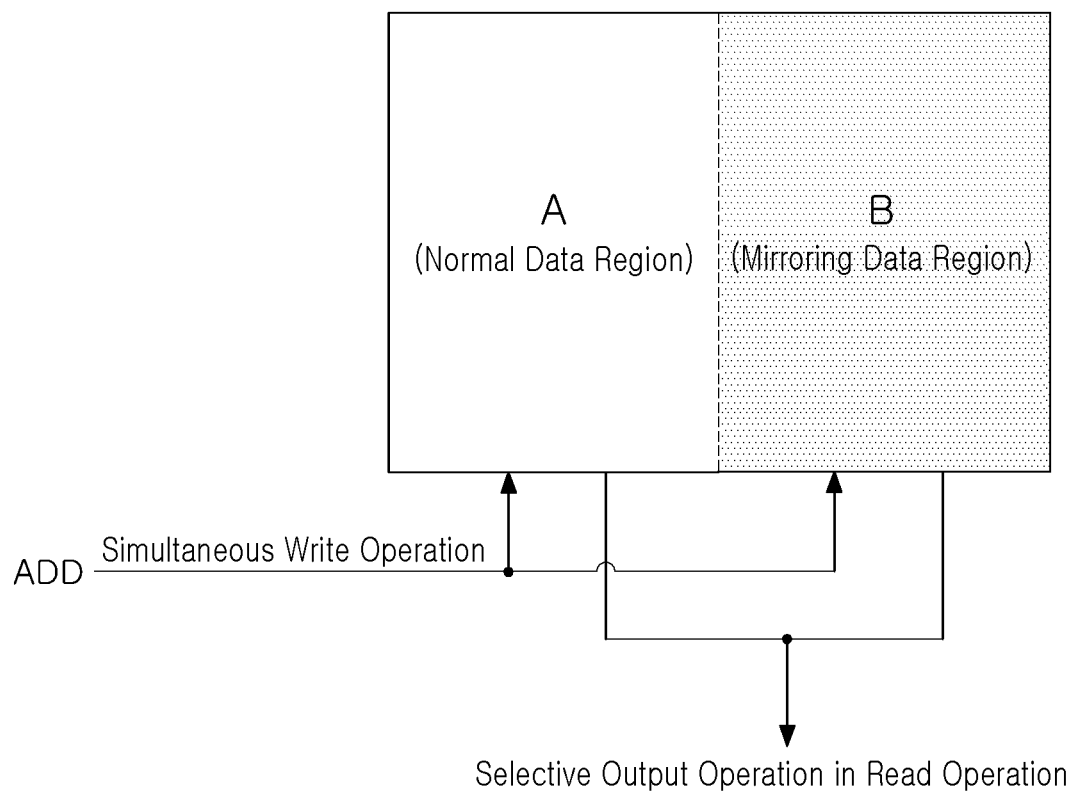
FIG. 3 is a diagram illustrating an on-die mirroring function of a memory chip according to an exemplary embodiment of the present inventive concept.

FIG. 3 is a diagram illustrating an on-die mirroring function of a memory chip according to an exemplary embodiment of the present inventive concept. Referring to FIG. 3, a memory chip may include a first area A (e.g., a normal data region) and a second area B (e.g., a mirroring data region). In a write operation, the same writing data may be written in the first area A and the second area B, corresponding to one address ADD. In a read operation, data reading in the first area A and the second area B corresponding to one address ADD may be selectively output by a data output path changing circuit. For example, the data output path changing circuit may set an external output of data of the first area A as a default of the data output path. In addition, the data output path changing circuit may change the data output path, to externally output data of the second area B, by a read retry command.

In addition, products and systems having on-die mirroring chips perform on-die mirroring for random bit or multi-bit failures in a memory evaluation step. Thus, even when a failure occurs in the system, defects may be repaired by using data in a mirroring area. The failed memory repairing method using the on-die mirroring chip and system may increase a yield and may increase memory productivity by reducing a test coverage burden for each evaluation operation.

Figure 4:
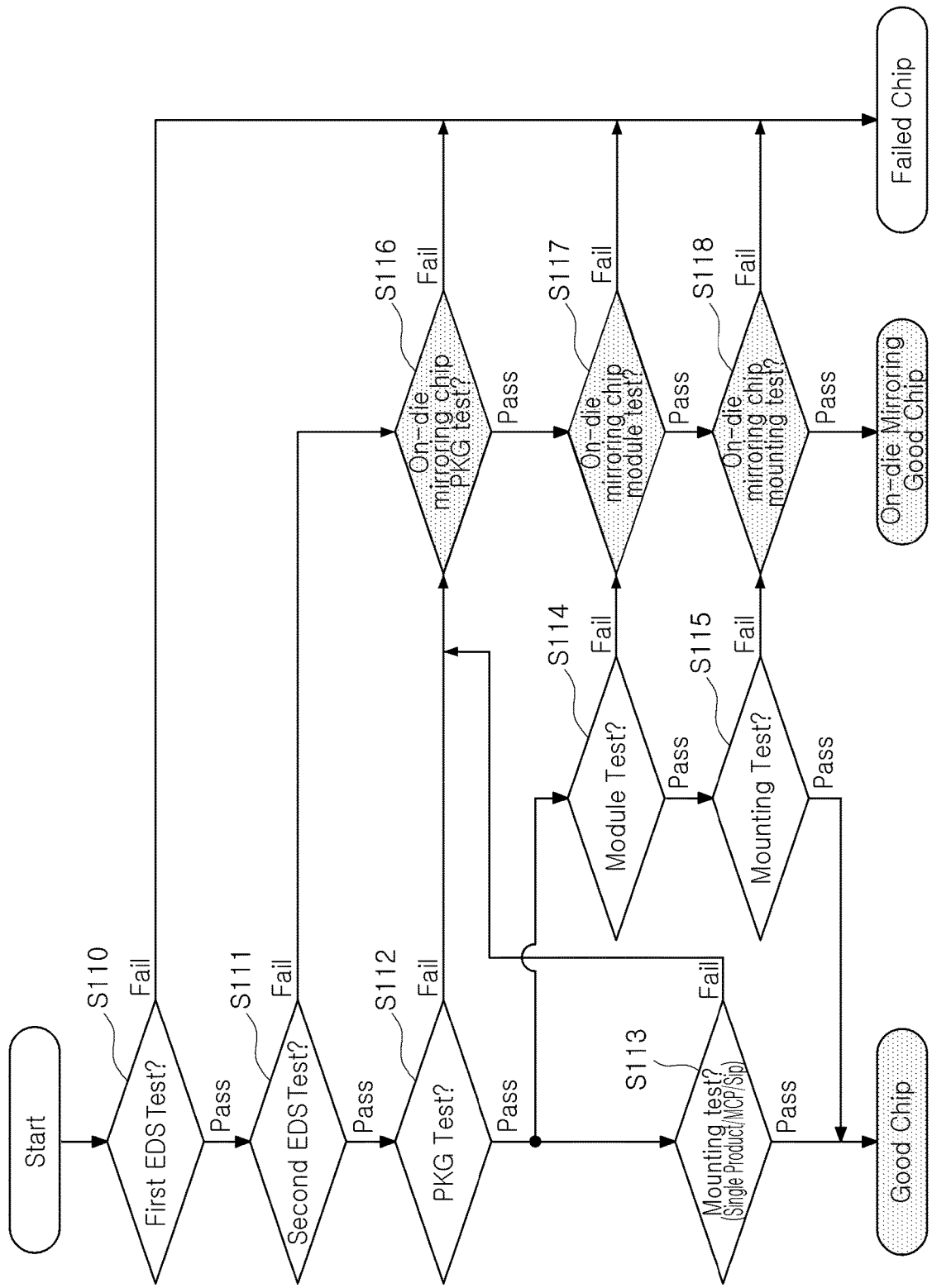
FIG. 4 is a diagram illustrating a method of repairing a failed memory chip according to an exemplary embodiment of the present inventive concept.

FIG. 4 is a diagram illustrating a method of repairing a failed memory chip, according to an exemplary embodiment of the present inventive concept. Referring to FIG. 4, a method of repairing a failed memory chip may be performed as follows.

A first EDS test is performed (S110), and when the first EDS test is passed, a second EDS test may be performed (S111). When the second EDS test is passed, a package test may proceed (S112). For example, when the package test (S112) is passed, a mounting test for a single product/MCP/SiP may be performed (S113) or a module test may be performed (S114). When the module test is passed, a mounting test may proceed (S115). When either of the mounting tests of operations (S113) and (S115) are passed, the memory chip may be processed as a good chip.

When the second EDS test of operation (S111) is failed, the package test of operation (S112) is failed, or the mounting test of operation (S113) is failed, an on-die mirroring chip package test (e.g., a repair package test) may be performed (S116). When the on-die mirroring chip package test (S116) is passed or when the module test of operation (S114) is failed, an on-die mirroring chip module test (e.g., a repair module test) may be performed (S117). When the on-die mirroring chip module test (S117) is passed or the mounting test of operation (S115) is failed, an on-die mirroring chip mounting test may be performed (S118).

For example, when the on-die mirroring chip mounting test (S118) is passed, the memory chip may be treated as an on-die mirroring good chip. In addition, when the on-die mirroring chip package test (S116) is failed, the on-die mirroring chip module test (S117) is failed, or the on-die mirroring chip mounting test (S118) is failed, the memory chip may be treated as a failed chip.

In a failed memory chip repairing method according to an exemplary embodiment of the present inventive concept, a test for an on-die mirroring function may be performed, and the memory chip may be treated as an on-die mirroring good chip depending on the result.

Figure 5:
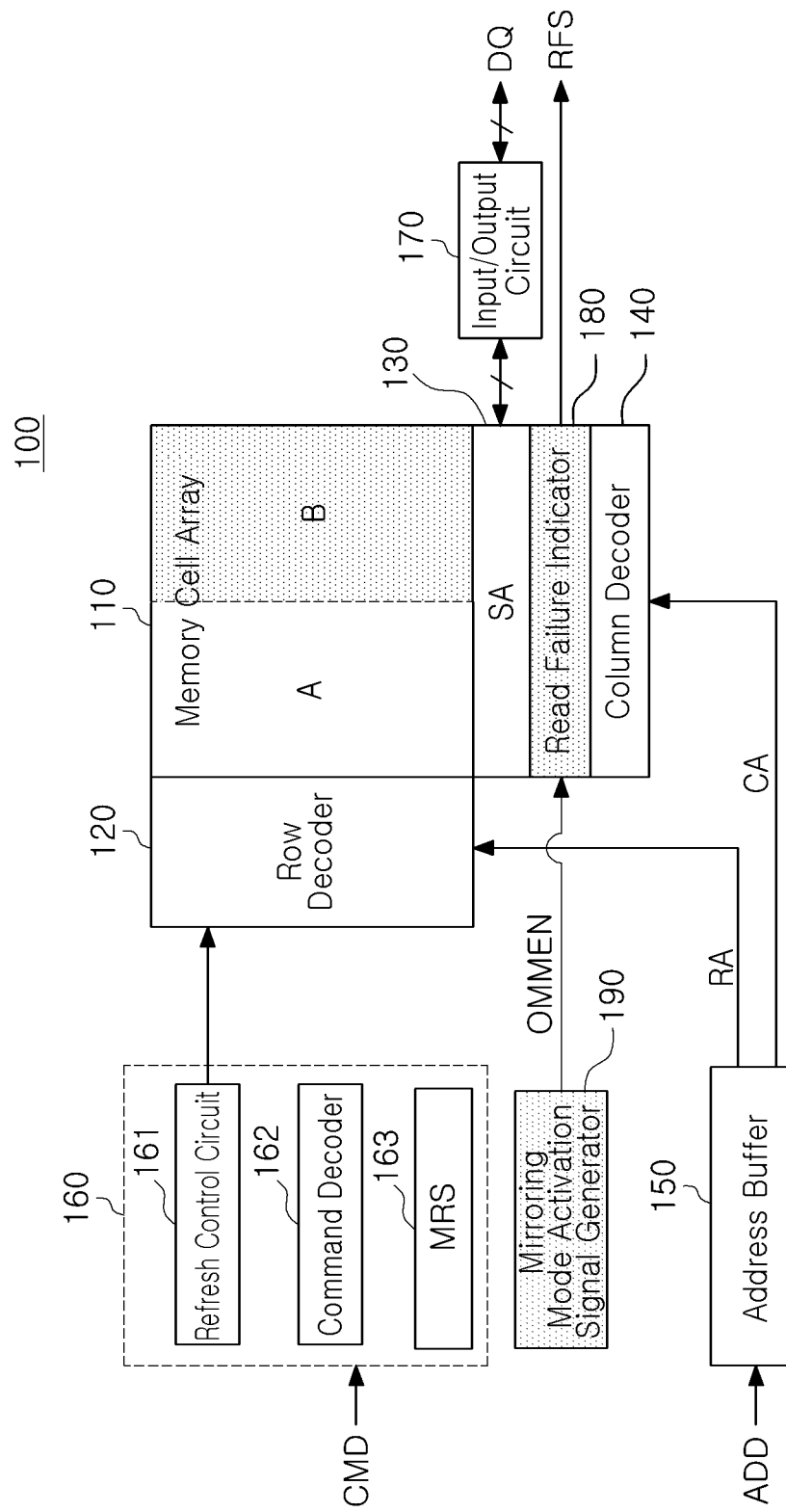
FIG. 5 is a diagram illustrating a memory chip according to an exemplary embodiment of the present inventive concept.

FIG. 5 is a diagram illustrating a memory chip 100 according to an exemplary embodiment of the present inventive concept. Referring to FIG. 5, the memory chip 100 may include a memory cell array 110, a row decoder 120, a sense amplifier circuit SA 130, a column decoder 140, an address buffer 150, a control logic 160, an input/output circuit 170, a read failure indicator 180, and a mirroring mode activation signal generator 190.

The memory cell array 110 may include a plurality of banks having a plurality of memory cells arranged in a row direction and a column direction. In this case, the memory cells may be a volatile/nonvolatile memory cell, respectively. In an exemplary embodiment of the present inventive concept, the memory cell array 110 may include a first area A and a second area B.

The row decoder 120 may be configured to select any one of the plurality of word lines in response to a row address RA. For example, the row decoder 120 may decode the row address RA output from the address buffer 150 and select a word line corresponding to the row address RA in a data writing/reading mode. For example, the memory cells of a first area A and the memory cells of a second area B may be activated at the same time by selecting the word lines by the row decoder 120 based on a row address RA.

The row decoder 120 may refresh a word line based on the row address generated by a refresh control circuit 161.

The sense amplifier circuit 130 may be configured to sense data by sensing/amplifying the voltage of the bit line selected by the column decoder 140. In a case in which a memory bank includes a plurality of sub arrays, the sense amplifier circuit 130 may include a plurality of sense amplifiers.

The column decoder 140 may be configured to select a bit line connected to the memory cell in response to a column address CA. For example, the column decoder 140 may decode the column address CA output from the address buffer 150, and may select a bit line corresponding to the column address CA in the data writing/reading mode.

The address buffer 150 may be configured to receive an address ADD from an external device, for example, a memory controller. In this case, the address ADD may include a row address RA, a column address CA, a bank address, a bank group address, and the like.

The control logic 160 may be configured to control the operation of the memory chip 100. The control logic 160 may include a refresh control circuit 161, a command decoder 162, and a mode register circuit (MRS) 163.

In an exemplary embodiment of the present inventive concept, the control logic 160 may be configured to change a data output path of a read operation from a data output path of the first area A to a data output path of the second area B in response to a read retry command in the mirroring mode.

The refresh control circuit 161 may receive a decoded refresh signal from the command decoder 162, and may output an internal row address to the row decoder 120 to refresh one word line of the memory cell array 110.

The command decoder 162 receives a command CMD from an external device (e.g., a memory controller (See, e.g., FIG. 9), and the command decoder 162 may internally generate command signals, for example, an activation signal, a reading signal, a write signal, a refresh signal, and the like, provided by decoding the received command CMD.

The mode register circuit 163 may set an internal mode register in response to an MRS/EMRS command for designating an operation mode of the memory chip 100. The mode register circuit 163 may output an activation signal to the input/output circuit 170 to control the operation of the input/output circuit 170 depending on the write operation/read operation. For example, the activation signal may be received directly from the mode register circuit 163; however, the present inventive concept is not limited thereto.

The input/output circuit 170 may receive data from an external device through DQ pins during the write operation, and may transfer the received data to the sense amplifier circuit 130. In addition, the input/output circuit 170 may receive data sensed by the sense amplifier circuit 130. The sensed data may be from memory cells corresponding to the address ADD during a read operation, and the input/output circuit 170 may output the received data to an external device (e.g., a host device, a controller, etc.) through the DQ pins.

The read failure indicator 180 may operate in response to an on-die mirroring mode activation signal. The read failure indicator 180 may detect an error in detected data during a read operation in an on-die mirroring mode, and may generate a read failure signal RFS corresponding to the detected error.

In an exemplary embodiment of the present inventive concept, the read failure indicator 180 may be configured to correct an error in the sensed data and generate a read failure signal RFS when error correction is failed.

The mirroring mode activation signal generator 190 may generate an on-die mirroring mode activation signal OMMEN.

Referring to FIG. 5, the memory chip 100 may further include a clock circuit generating a clock signal, a power circuit generating or distributing an internal voltage by receiving a power supply voltage applied from an external device (e.g., a power supply).

Figure 6:
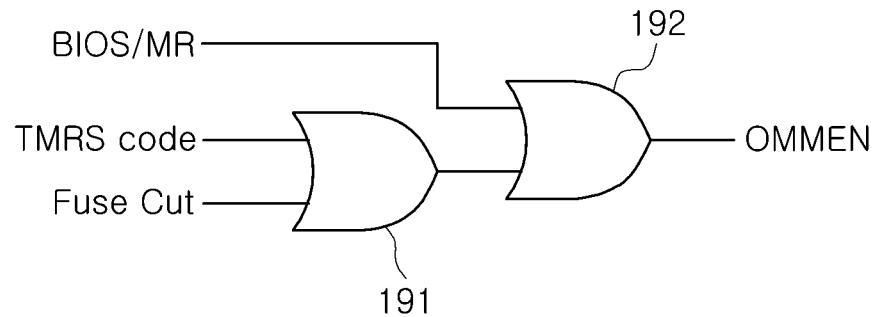
FIG. 6 is a diagram illustrating a mirroring mode activation signal generator according to an exemplary embodiment of the present inventive concept.

FIG. 6 is a diagram illustrating the mirroring mode activation signal generator 190 according to an exemplary embodiment of the present inventive concept. Referring to FIG. 6, the mirroring mode activation signal generator 190 may include a first logic circuit 191 and a second logic circuit 192.

The first logic circuit 191 may be configured to OR operate a received test mode register set (TMRS) code value and received fuse cut information. In this case, the fuse cut information may be generated through fuse cutting corresponding to the on-die mirroring mode in the test operation described with reference to FIGS. 3 and 4. Thus, the fuse cut information may be determined in the test operation.

The second logic circuit 192 may generate the on-die mirroring mode activation signal OMMEN by OR-operating the received basic input/output system (BIOS)/mode register (MR) value and a received output value of the first logic circuit 191. For example, the BIOS/MR value may be a predetermined value.

In an exemplary embodiment of the present inventive concept, the memory chip 100 may forcibly perform an on-die mirroring function through a fuse option. In this case, the fuse option may allow the on-die mirroring function to be performed as a default in the case of a soft failure (e.g., a Random Single Bit failure or a Multi-Bit failure) during the memory chip evaluation operation.

Figure 7:
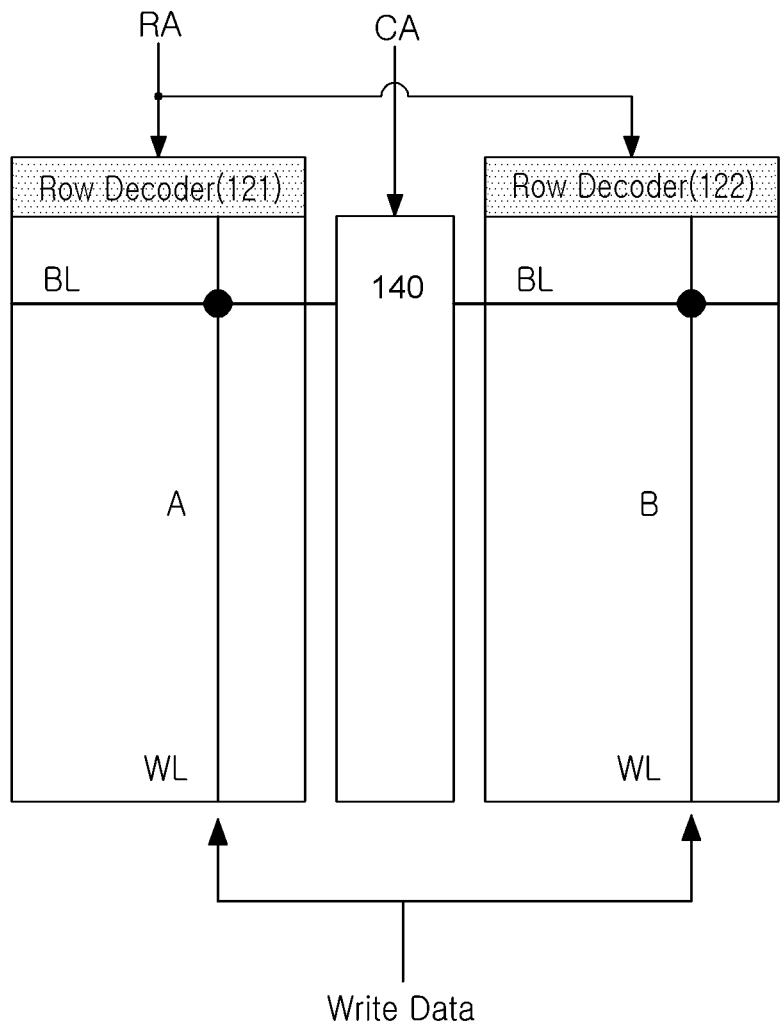
FIG. 7 is a diagram illustrating a write operation of the memory chip in an on-die mirroring mode according to an exemplary embodiment of the present inventive concept.

FIG. 7 is a diagram illustrating a write operation of the memory chip 100 in the on-die mirroring mode according to an exemplary embodiment of the present inventive concept. Referring to FIG. 7, the writing data may be written to a memory cell connected to a selected word line WL and a selected bit line BL in each of the first area A and the second area B, in response to a row address RA and a column address CA. The same data may be written to two memory cells corresponding to one row address RA.

The first area A and the second area B illustrated in FIG. 7 may be accessed through the column decoder 140 that is shared by row decoders 121 and 122 corresponding to the first area A and the second area B, but the structure of the row decoder/column decoder is not limited thereto.

Figure 8A:
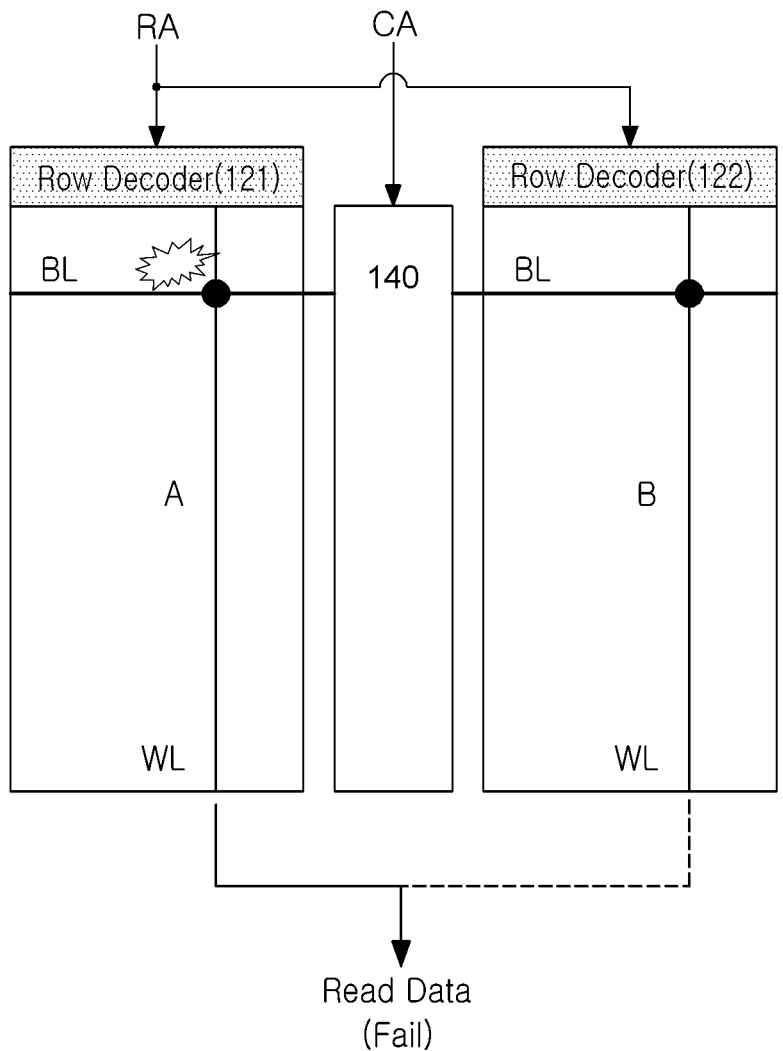
FIG. 8A is a diagram illustrating a read failure process in an on-die mirroring mode according to an exemplary embodiment of the present inventive concept.
Figure 8B:
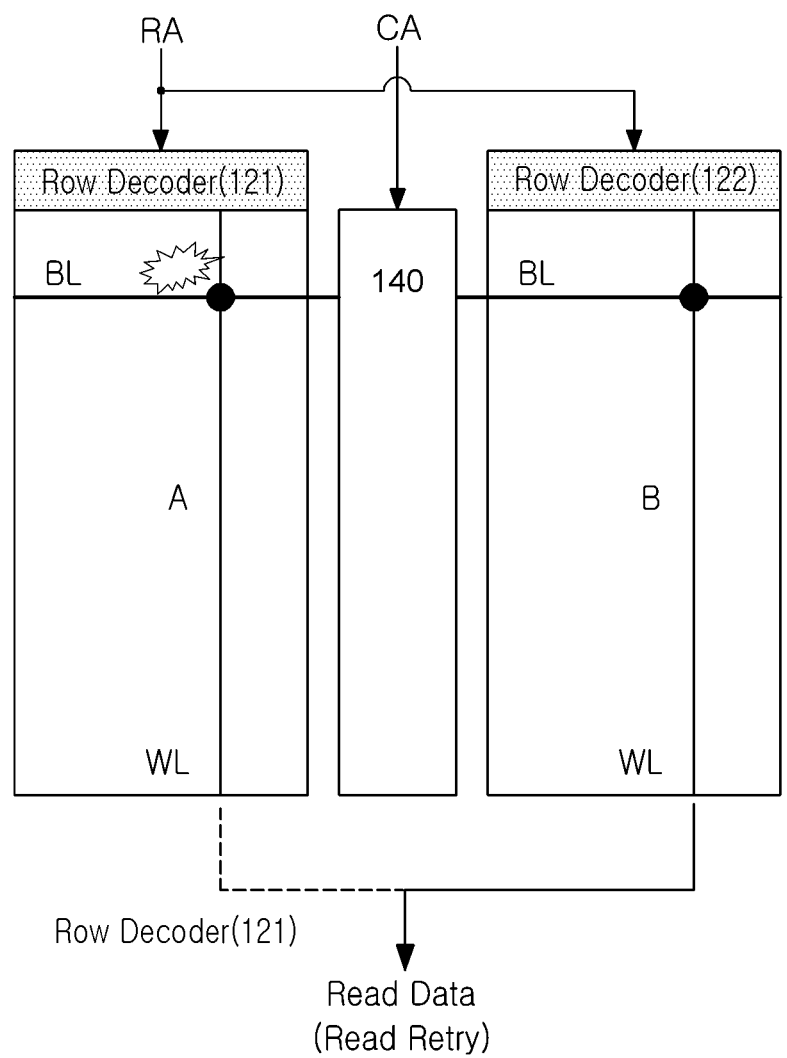
FIG. 8B is a read retry process in the on-die mirroring mode according to an exemplary embodiment of the present inventive concept.

FIG. 8A is a diagram illustrating a read failure process in an on-die mirroring mode according to an exemplary embodiment of the present inventive concept, and FIG. 8B is a read retry process in the on-die mirroring mode according to an exemplary embodiment of the present inventive concept.

Referring to FIG. 8A, for example, when a memory cell of the first area A is defective, there may be a failure to read the reading data. When reading fails, the memory chip 100 may transmit a read failure signal RFS to an external device (e.g., a memory controller).

Referring to FIG. 8B, when a read retry request is received from an external device, the memory chip 100 may output data read from the memory cell of the second area B as reading data.

In addition, an exemplary embodiment of the present inventive concept thereof is not limited to read retry. A memory chip according to an exemplary embodiment of the present inventive concept may output data of a memory cell of the second area B to an external device without the memory cell of the first area A transmitting a read failure signal (RFS) for requesting a read retry to the external device, upon a read failure of the first area A. For example, the output data of the memory cell of the second area B to an external device may not be in response to a transmission of a read failure signal for requesting a read retry.

Figure 9:
FIG. 9 is a diagram illustrating a configuration of a row address according to an exemplary embodiment of the present inventive concept.

FIG. 9 is a diagram illustrating a configuration of a row address RA according to an exemplary embodiment of the present inventive concept. Referring to FIG. 9, the row address RA may include k row address bits ADD1, ADD2, ADD3, . . . , and ADDk. According to an exemplary embodiment of the present inventive concept, a most significant bit (MSB) of the row address ADD, for example, a first address bit ADD1, may be ignored by the row decoder 120 of the memory chip 100 (Don't Care). For example, the memory chip 100 may access the first area A and the second area B by k−1 address bits.

In an exemplary embodiment of the present inventive concept, a pin transmitting the most significant bit MSB (ADD1) of the row address RA in the memory chip 100 may be used as the pin transmitting a read failure signal RFS. For example, a pin that transmits the most significant bit MSB of the row address RA when the memory cell is defective may output a high level signal to the memory controller.

Figure 10:
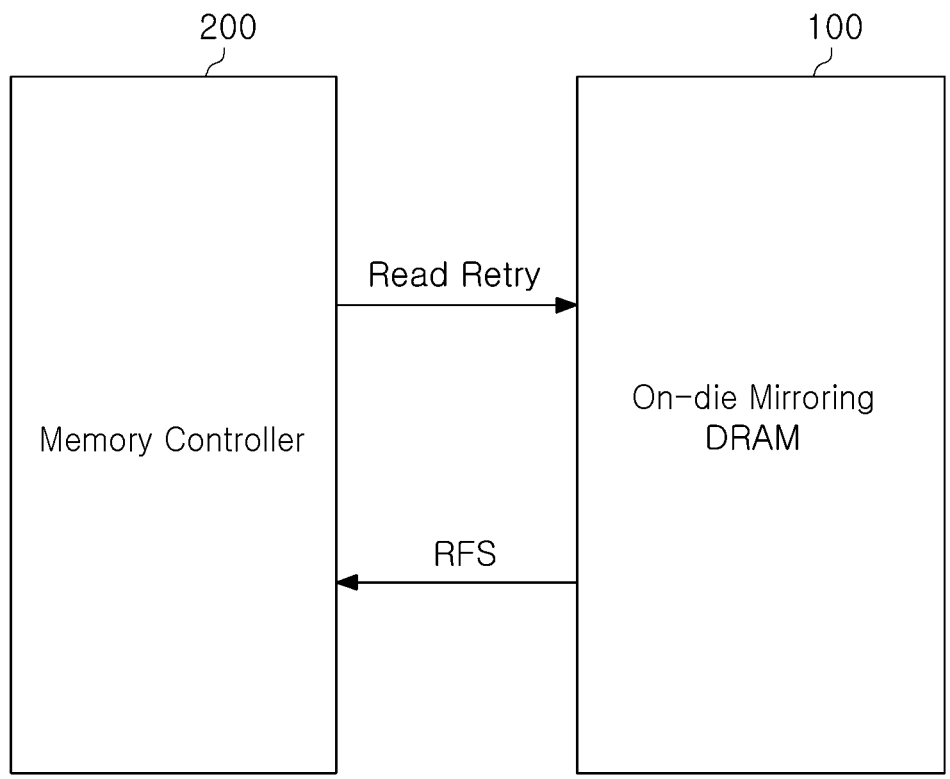
FIG. 10 is a diagram illustrating a memory system according to an exemplary embodiment of the present inventive concept.

FIG. 10 is a diagram illustrating a memory system 10 according to an exemplary embodiment of the present inventive concept. Referring to FIG. 10, the memory system 10 may include an on-die mirroring memory chip 100 and a memory controller 200.

The on-die mirroring memory chip 100 may set fuse cutting to an on-die mirroring mode in a memory test.

The on-die mirroring memory chip 100 may generate an error indication signal EIS when a read operation is failed in a read operation of the on-die mirroring mode, and may transmit the error indication signal EIS to the memory controller 200. According to an exemplary embodiment of the present inventive concept, the on-die mirroring memory chip 100 may change a path of a read operation in response to a read retry command from the memory controller 200 and output data of the mirroring area B.

The memory controller 200 may be configured to control the on-die mirroring memory chip 100. In an exemplary embodiment of the present inventive concept, the memory controller 200 may generate a read retry command in response to the error indication signal EIS and transmit the read retry command to the on-die mirroring memory chip 100.

Figure 11:
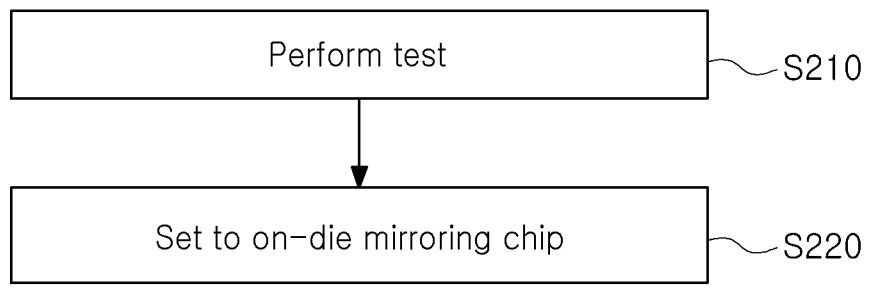
FIG. 11 is a diagram illustrating a test method of a test apparatus for a memory chip according to an exemplary embodiment of the present inventive concept.

FIG. 11 is a diagram illustrating a test method of a test apparatus for a memory chip according to an exemplary embodiment of the present inventive concept. Referring to FIGS. 3 to 11, a memory chip test method of a test apparatus may proceed as follows. The test apparatus may test whether the memory chip performs a normal operation (S120). As a result of the test, when it is difficult to perform a normal operation, the test apparatus may forcibly set the memory chip to the on-die mirroring mode (S220). For example, if a random single bit failure or a multi-bit failure is detected in the memory chip, the memory chip is set to the on-die mirroring mode.

In a dynamic random access memory (DRAM) having an on-die mirroring scheme and a system equipped with the same according to an exemplary embodiment of the present inventive concept, a system for ensuring system reliability may be applied. Therefore, in a case in which a memory single bit error or multi-bit error occurs in defective DRAM and rejection that occurs in DRAM memory evaluation steps (for example, a wafer evaluation step, a PKG evaluation step, a module/mounting evaluation step), the mirroring mode operation may be performed, thereby repairing a defect and significantly increasing productivity.

A memory system according to an exemplary embodiment of the present inventive concept may use a system that receives a failure occurrence signal from a DRAM and an On-die Mirroring DRAM (e.g., an On-die Mirroring device, a memory failure determining device, a device of changing an output area to a mirrored area when a failure occurs, a failure occurrence indicator device), and performs a read retry. A memory applied to such a system may perform a half chip operation and a mirroring operation by fusing the on-die mirroring operation on a defective product in the DRAM memory evaluation operation. The system may perform the on-die mirroring operation of products that contain defects, and thus, the memory device may perform a normal operation by a mirroring operation even when a defect occurs, and reliability against potential defects may be increased.

In an exemplary embodiment of the present inventive concept, a default mirror operation may be performed on a defective sample, and a sample to be rejected for a random single bit or multi-bit failure may be used as a good sample regardless of a defective position. Accordingly, according to an exemplary embodiment of the present inventive concept, a yield reduction due to the reject may be reduced, thereby providing an overall increase in yield and a significant increase in productivity by removing defects per step and factors that hinder the productivity by enhanced test coverage.

The memory chip according to an exemplary embodiment of the present inventive concept may forcibly perform an on-die mirroring operation through a fusing option. In this case, the fusing option may default, a soft defect (a random single bit or multi-bit) during the DRAM evaluation step, to the on-die mirroring DRAM operation. In an exemplary embodiment of the present inventive concept, the on-die mirroring chip by fusing may be assembled as a PKG, a Multi-Chip-Package (MCP), a module, a System In Package (SiP), or the like. In an exemplary embodiment of the present inventive concept, in the fused on-die mirroring chip, an output path may be changed from a current data output path to a mirrored area at a point in time at which a failure occurs in the random failure, and at the same time, a reading request from a system host may be generated. In an exemplary embodiment of the present inventive concept, the system may use data in the mirrored area by performing read retry.

In an exemplary embodiment of the present inventive concept, a defective sample generated per each memory evaluation step may be further evaluated in an on-die mirroring mode without rejecting, and thus, the product may be shipped during a pass operation. In this case, there may be an effect of increasing productivity and reducing the burden on poor test coverage or system compatibility.

An on-die mirroring chip according to an exemplary embodiment of the present inventive concept may be applied to a PKG, a Multi-Chip-Package (MCP) and a System In Package (SiP). In addition, the on-die mirroring chip may be included in all of single-unit mounting and modularizing and the like, and may be applied to applications such as automotive, Data Center (DC), mobile phones (e.g., a Smart Phone), PC (Personal Computer) or the like, using such a product.

Exemplary embodiments of the present inventive concept may also be applied to a mobile device.

Figure 12:
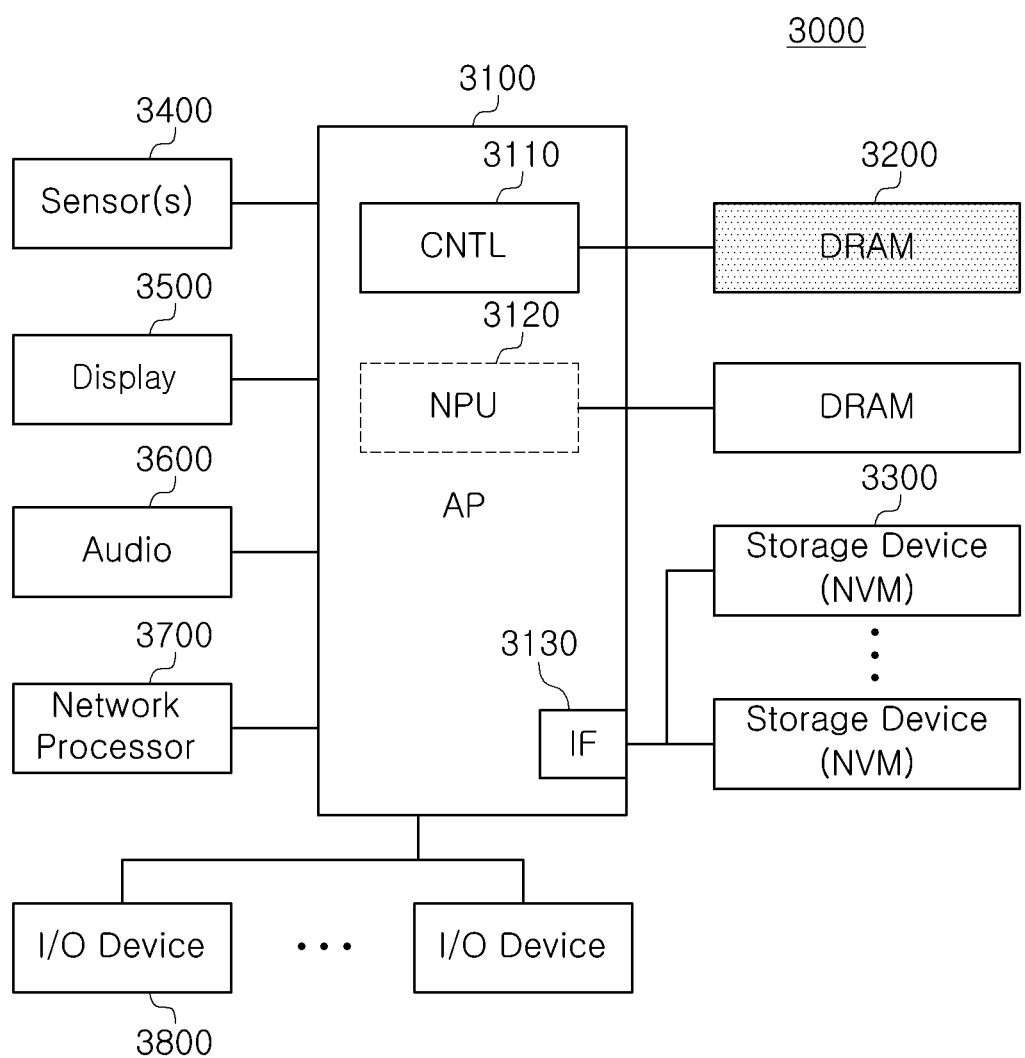
FIG. 12 is a diagram illustrating a mobile device according to an exemplary embodiment of the present inventive concept.

FIG. 12 is a diagram illustrating a mobile device 3000 according to an exemplary embodiment of the present inventive concept. Referring to FIG. 12, the mobile device 3000 may include an application processor 3100, at least one DRAM 3200, at least one storage device 3300, at least one sensor 34000, a display device 3500, and audio device 3600, a network processor 3700 and at least one input/output device 3800. For example, the mobile device 3000 may be implemented as a laptop computer, a mobile phone, a smartphone, a tablet personal computer, or a wearable computer.

The application processor 3100 may be configured to control an overall operation of the mobile device 3000. The application processor 3100 may execute applications that provide, for example, an internet browser, a game, a video, and the like. In an exemplary embodiment of the present inventive concept, the application processor 3100 may include a single core or a multi-core. For example, the application processor 3100 may include a multi-core such as dual-core, quad-core, and hexa-core. In an exemplary embodiment of the present inventive concept, the application processor 3100 may further include a cache memory located internally or externally.

The application processor 3100 may include a controller 3110, a Neural Processing Unit (NPU) 3120, and an interface 3130. In an exemplary embodiment of the present inventive concept, the NPU 3120 may be provided or omitted.

In an exemplary embodiment of the present inventive concept, the application processor 3100 may be implemented as a system-on-chip (SoC). A kernel of an operating system that runs on a system-on-chip (SoC) may include, for example, an input/output (I/O) scheduler and a device driver controlling the storage device 3300. The device driver may control the access performance of the storage device 3300 with reference to a number of sync queues managed by the input/output scheduler, or may control a CPU mode, a DVFS level, or the like in the SoC (System-on-Chip).

The DRAM 3200 may be connected to the controller 3110. The DRAM 3200 may store data required for the operation of the application processor 3100. For example, the DRAM 3200 may temporarily store the operating system (OS) and application data or may be used as an execution space of various software codes.

The DRAM 3200 may perform the on-die mirroring operation described with reference to FIGS. 3 to 11 or may be implemented as an on-die mirroring chip. A DRAM 3200 may be connected to the NPU 3120. The DRAM 3200 may store data related to, for example, artificial intelligence (AI) calculations.

The storage device 3300 may be connected to the interface 3130. In an exemplary embodiment of the present inventive concept, the interface 3130 may be operated by, for example, any one communication protocol among double data rate (DDR), DDR2, DDR3, DDR4, Low Power DDR (LPDDR), a Universal Serial Bus (USB), a Multimedia Card (MMC), embedded MMC, Peripheral Component Interconnection (PCI), a non-volatile memory express (NVMe), a peripheral component interconnect express (PCIe), serial at attachment (SATA), a small computer system interface (SCSI), serial attached SCSI (SAS), universal storage bus (USB) attached SCSI (UAS), an internet small computer system interface (iSCSI), a fiber channel, and/or a fiber channel over ethernet (FCoE). In an exemplary embodiment of the present inventive concept, any one storage device 3300 may be included in the mobile device 3000 in an embedded form. In an exemplary embodiment of the present inventive concept, any one storage device 3300 may be included in the mobile device 3000 in a detachable manner.

The storage device 3300 may be configured to store user data. For example, the storage device 3300 may store data collected from the sensor 3400, or may store network data, Augmented Reality (AR)/Virtual Reality (VR) data, and/or High Definition (HD) 4K content. The storage device 3300 may include at least one nonvolatile memory device. For example, the storage device 3300 may include a solid state driver (SSD), an embedded multimedia card (eMMC), or the like.

In an exemplary embodiment of the present inventive concept, the storage device 3300 may be implemented as a separate chip in the application processor 3100, or may be implemented as a single package with the application processor 3100. For example, the storage device 3300 may be separated from the application processor 3100 in the mobile device 3000.

In an exemplary embodiment of the present inventive concept, the storage device 3300 may be mounted using various types of packages. For example, the storage device 3300 may be mounted using packages, such as Package on Package (PoP), Ball grid arrays (BGAs), Chip scale packages (CSPs), Plastic Leaded Chip Carrier (PICC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP) or the like.

The sensor 3400 may be configured to sense an external environment of the mobile device 3000. In an exemplary embodiment of the present inventive concept, the sensor 3400 may include an image sensor that senses an image. In this case, the sensor 3400 may transmit the generated image information to the application processor 3100. In an exemplary embodiment of the present inventive concept, the sensor 3400 may include a biosensor detecting biometric information. For example, the sensor 3400 may detect a fingerprint, an iris pattern, a blood vessel pattern, a heart rate, a blood sugar level, and the like, and may generate sensing data corresponding to the detected information. In addition, the sensor 3400 is not limited to the image sensor and the biosensor. For example, the sensor 3400 may include any sensor, such as an illuminance sensor, an acoustic sensor, an acceleration sensor, or the like.

The display device 3500 may be configured to output data. For example, the display device 3500 may output image data sensed using the sensor 3400 or output data calculated using the application processor 3100.

The audio device 3600 may be configured to externally output voice data or detect external voice.

The network processor 3700 may be configured to communicate with an external device by a wired or wireless communication method.

The input/output device 3800 may be configured to input data to or output data from the mobile device 3000. The input/output device 3800 may include devices that provide digital input and output functions such as a USB, storage, a digital camera, a SD card, a touch screen, DVD, modem, and a network adapter.

In addition, exemplary embodiments of the present inventive concept may be applied to various kinds of computing systems, for example, central processing unit (CPU)/graphics processing unit (GPU)/network processing unit (NPU) platforms.

Figure 13:
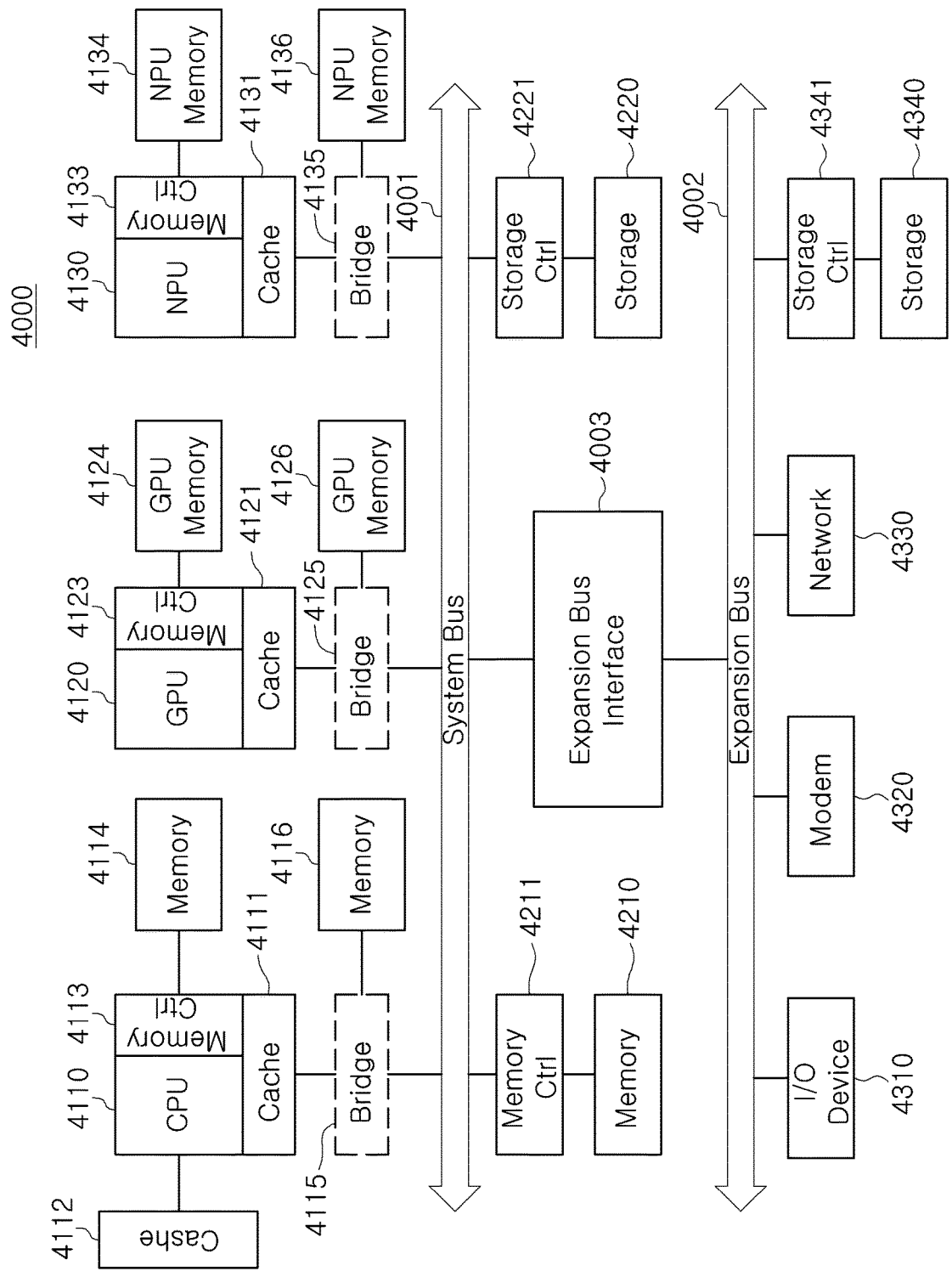
FIG. 13 is a diagram illustrating a computing system according to an exemplary embodiment of the present inventive concept.

FIG. 13 is a diagram illustrating a computing system 4000 according to an exemplary embodiment of the present inventive concept. Referring to FIG. 13, the computing system 4000 may include a Central Processing Unit (CPU) 4110, a Graphics Processing Unit (GPU) 4120, and/or a Neural Processing Unit (NPU) 4130 (or an application-specific processing unit), connected to a system bus 4001. The computing system 4000 may further include a memory device 4210 or a storage device 4220 connected to the system bus 4001. The computing system 4000 may additionally include an input/output device 4310, a modem 4320, a network device 4330 and/or a storage device 4340, connected to an expansion bus 4002. In this case, the expansion bus 4002 may be connected to the system bus 4001 through an expansion bus interface 4003.

In an exemplary embodiment of the present inventive concept, the CPU 4110, the GPU 4120 and the NPU 4130 may include on-chip caches 4111, 4121 and 4131, respectively.

In an exemplary embodiment of the present inventive concept, the CPU 4110 may include an off-chip cache 4112. In addition, each of the GPU 4120 and the NPU 4130 may include an off-chip cache. In an exemplary embodiment of the present inventive concept, the off-chip cache 4112 may be internally connected to the CPU 4110, the GPU 4120, and the NPU 4130 through different buses.

In an exemplary embodiment of the present inventive concept, the on-chip/off-chip cache may include a volatile memory such as a dynamic random access memory (DRAM), a static random access memory (SRAM) or the like, or a nonvolatile memory such as a NAND flash memory, a phase random access memory (PRAM), a resistive random access (RRAM) or the like.

In an exemplary embodiment of the present inventive concept, main memories 4114, 4124 and 4134 may be respectively connected to the CPU 4110, the GPU 4120 and the NPU 4130 through corresponding memory controllers 4113, 4123 and 4133. According to an exemplary embodiment of the present inventive concept, at least one of the main memories 4114, 4124 and 4134 may perform the on-die mirroring operation described in FIGS. 3 to 11 or include an on-die mirroring chip.

In an exemplary embodiment of the present inventive concept, memories 4116, 4126 and 4136 may be respectively connected to the CPU 4110, the GPU 4120 and the NPU 4130 through bridges 4115, 4125 and 4135. The bridges 4115, 4125 and 4135 may include memory controllers that control the corresponding memories 4116, 4126 and 4136. In an exemplary embodiment of the present inventive concept, any of the bridges 4115, 4125 and 4135 may be implemented as a network device, a wireless network device, a switch, a bus, a cloud, or an optical channel.

In an exemplary embodiment of the present inventive concept, the main memory may include a volatile memory such as a DRAM, an SRAM or the like, or a nonvolatile memory such as a NAND flash memory, a PRAM, a RRAM or the like. The main memory may have a lower latency and a lower capacity than those of secondary storages 4210 and 4220, for example, the memory device 4210 and the storage device 4220.

The CPU 4110, the GPU 4120, or the NPU 4130 may access the secondary storages 4210 and 4220 through a system bus 4001. The memory device 4210 may be controlled by a memory controller 4211. In this case, the memory controller 4211 may be connected to the system bus 4001. The storage device 4220 may be controlled by a storage controller 4221. The storage controller 4221 may be connected to the system bus 4001.

The storage device 4220 may be configured to store data. The storage controller 4221 may be configured to read data from the storage device 4220 and transmit the reading data to a host. The storage controller 4221 may be configured to store transmitted data in the storage device 4220 in response to a request from the host. Each of the storage device 4220 and the storage controller 4221 may include a buffer that stores metadata, reads a cache to store frequently-accessed data, or stores a cache to increase writing efficiency. For example, a write cache may receive and process a specific number of write requests.

The storage device 4220 may include a volatile memory such as a hard disk drive (HDD) and a nonvolatile memory such as a non-volatile random access memory (NVRAM), an SSD, a storage class memory (SCM) or a new memory.

In addition, an exemplary embodiment of the present inventive concept may be applied to a data server system.

Figure 14:
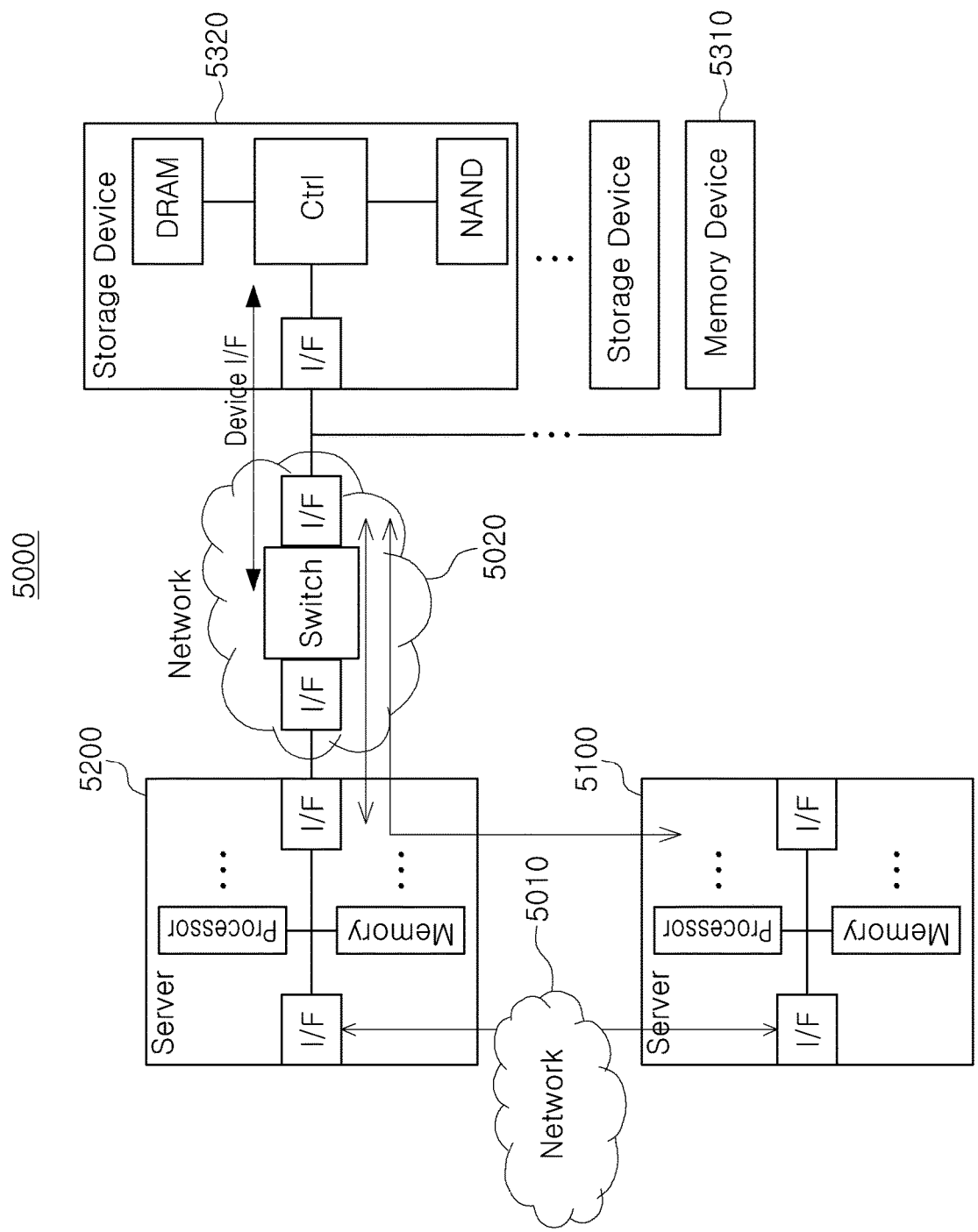
FIG. 14 is a diagram illustrating a data server system according to an exemplary embodiment of the present inventive concept.

FIG. 14 is a diagram illustrating a data server system 5000 according to an exemplary embodiment of the present inventive concept. Referring to FIG. 14, the data server system 5000 includes a first server 5100 (e.g., an application server), a second server 5200 (e.g., a storage server), a memory device 5310, and at least one storage device 5320.

Each of the first server 5100 and the second server 5200 may include at least one processor and memory. In an exemplary embodiment of the present inventive concept, each of the first server 5100 and the second server 5200 may be implemented as a memory-processor pair. In an exemplary embodiment of the present inventive concept, each of the first server 5100 and the second server 5200 may be implemented with a different number of processors and memories.

In an exemplary embodiment of the present inventive concept, the first server 5100 and the second server 5200 may perform communications through a first network 5010. According to an exemplary embodiment of the present inventive concept, each of the first server 5100 and the second server 5200 may access the memory device 5310 through the first network 5010 and/or a second network 5020. In an exemplary embodiment of the present inventive concept, each of the first server 5100 and the second server 5200 may directly or indirectly access the storage device 5320 through the first network 5010 and the second network 5020.

In an exemplary embodiment of the present inventive concept, an interface I/F of the storage device 5320 may include SATA, SAS, PCIe, Dual In-Line Memory Module (DIMM), high bandwidth memory (HBM), Hybrid Memory Cube (HMC), or non-volatile dual in-line memory module (NVDIMM).

In an exemplary embodiment of the present inventive concept, the second network 5020 may be in the form of a Direct-attached storage (DAS), Network-attached storage (NAS) or storage area network (SAN) connection.

In an exemplary embodiment of the present inventive concept, the memory device 5310 and the storage device 5320 may respectively transmit device information to the second server 5200 by a command or by itself. In an exemplary embodiment of the present inventive concept, the memory device 5310 may perform the on-die mirroring operation described with reference to FIGS. 3 to 11 or may include an on-die mirroring chip.

The data server system 5000 may perform big data AI calculation. In this case, the big data may include audio, photo, video, or weight/training data.

As set forth above, in a memory chip and a method for testing the memory chip according to an exemplary embodiment of the present inventive concept, a memory chip may be repaired by setting an on-die mirroring mode through a fusing operation, in a case in which a memory defect occurs.

In addition, in a memory chip and a method for testing the memory chip according to an exemplary embodiment of the present inventive concept, productivity may be increased by repairing a memory chip having a random bit failure or a multi-bit failure with an on-die mirroring chip.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A memory chip comprising:
a memory cell array having a first area and a second area, wherein each of the first area and the second area has a plurality of memory cells connected to word lines and bit lines;
a row decoder configured to select one of the word lines in response to a row address;
a sense amplifier circuit configured to sense data from memory cells connected to selected bit lines during a read operation;
a column decoder configured to select the selected bit lines from among the bit lines in response to a column address;
an address buffer configured to store an address having the row address and the column address;
a read failure indicator configured to detect an error in the sensed data and generate a read failure signal corresponding to the error;
a mirroring mode activation signal generator configured to generate a mirroring mode activation signal corresponding to a mirroring mode by a fusing operation; and
a control logic configured to write a same writing data to the first area and the second area during a write operation in the mirroring mode, and change a data output path of a read operation from a data output path of the first area to a data output path of the second area in response to a read retry command in the mirroring mode.

2. The memory chip of claim 1, wherein the row decoder comprises a first row decoder corresponding to the first area, and a second row decoder corresponding to the second area, wherein each of the first row decoder and the second row decoder selects one of the word lines in response to the row address.

3. The memory chip of claim 1, wherein the column decoder selects a first bit line corresponding to the first area in response to the column address, and a second bit line corresponding to the second area in response to the column address.

4. The memory chip of claim 1, wherein the mirroring mode activation signal generator comprises:
a first logic circuit configured to perform an OR operation for a Test Mode Register Set (TMRS) code value and fuse cut information by the fusing operation; and a second logic circuit configured to generate the mirroring mode activation signal by performing an OR operation for a basic input/output system (BIOS) or a mode register (MR) value and an output value of the first logic circuit.

5. The memory chip of claim 1, further comprising an input/output circuit configured to receive the sensed data from the sense amplifier and to output the received sensed data to an external device.

6. The memory chip of claim 1, wherein a most significant bit of the row address is ignored in the mirroring mode.

* * * * *